(12) United States Patent
Cheng et al.

(10) Patent No.: US 11,545,513 B2
(45) Date of Patent: *Jan. 3, 2023

(54) IMAGE SENSOR HAVING IMPROVED FULL WELL CAPACITY AND RELATED METHOD OF FORMATION

(71) Applicant: Taiwan Semiconductor Manufacturing Co., Ltd., Hsin-Chu (TW)

(72) Inventors: Yu-Hung Cheng, Tainan (TW); Shyh-Fann Ting, Tainan (TW); Yen-Ting Chiang, Tainan (TW); Yeur-Luen Tu, Taichung (TW); Min-Ying Tsai, Kaohsiung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/187,955

(22) Filed: Mar. 1, 2021

(65) Prior Publication Data

US 2021/0183921 A1 Jun. 17, 2021

Related U.S. Application Data

(60) Continuation of application No. 16/815,409, filed on Mar. 11, 2020, now Pat. No. 10,971,534, which is a (Continued)

(51) Int. Cl.
*H01L 27/146* (2006.01)
*H04N 5/365* (2011.01)
(Continued)

(52) U.S. Cl.
CPC ...... *H01L 27/1463* (2013.01); *H01L 27/1464* (2013.01); *H01L 27/1469* (2013.01);
(Continued)

(58) Field of Classification Search
CPC ......... H01L 27/14612; H01L 27/14621; H01L 27/14627; H01L 27/1463; H01L 27/14634;
(Continued)

(56) References Cited

U.S. PATENT DOCUMENTS 9,659,989 B1 * 5/2017 Ai ..................... H01L 27/14645
9,899,441 B1 * 2/2018 Cheng ............... H01L 27/14627
(Continued)

FOREIGN PATENT DOCUMENTS

CN 108231814 A 6/2018
CN 108336064 A 7/2018

OTHER PUBLICATIONS

York, Timothy. "Fundamentals of Image Sensor Performance." Published on Apr. 24, 2011. Retrieved online on Mar. 28, 2018 from https://www.cse.wustl.edu/~jain/cse567-11/ftp/imgsens/index.html.
(Continued)

*Primary Examiner* — David C Spalla
(74) *Attorney, Agent, or Firm* — Eschweiler & Potashnik, LLC

(57) ABSTRACT

In some embodiments, a method is provided. The method includes forming a plurality of trenches in a semiconductor substrate, where the trenches extend into the semiconductor substrate from a back-side of the semiconductor substrate. An epitaxial layer comprising a dopant is formed on lower surfaces of the trenches, sidewalls of the trenches, and the back-side of the semiconductor substrate, where the dopant has a first doping type. The dopant is driven into the semiconductor substrate to form a first doped region having the first doping type along the epitaxial layer, where the first doped region separates a second doped region having a second doping type opposite the first doping type from the sidewalls of the trenches and from the back-side of the
(Continued)

semiconductor substrate. A dielectric layer is formed over the back-side of the semiconductor substrate, where the dielectric layer fill the trenches to form back-side deep trench isolation structures.

20 Claims, 9 Drawing Sheets

Related U.S. Application Data division of application No. 16/113,066, filed on Aug. 7, 2018, now Pat. No. 10,658,410.

(51) Int. Cl.
*H01L 21/762* (2006.01)
*H01L 31/0216* (2014.01)

(52) U.S. Cl.
CPC .. *H01L 27/14634* (2013.01); *H01L 27/14636* (2013.01); *H01L 27/14645* (2013.01); *H01L 27/14612* (2013.01); *H01L 27/14621* (2013.01); *H01L 27/14627* (2013.01); *H01L 27/14685* (2013.01)

(58) Field of Classification Search
CPC ........... H01L 27/14636; H01L 27/1464; H01L 27/14643; H01L 27/14645; H01L 27/14685; H01L 27/14689; H01L 27/1469
See application file for complete search history.

(56) References Cited

U.S. PATENT DOCUMENTS

| | | | |
|---|---|---|---|
| 10,971,534 B2 * | 4/2021 | Cheng | ................ H01L 27/1464 |
| 2002/0187581 A1 | 12/2002 | Yang | |
| 2012/0033119 A1 | 2/2012 | Shinohara | |
| 2014/0073080 A1 | 3/2014 | Chuang et al. | |
| 2015/0091121 A1 * | 4/2015 | Manda | ............. H01L 27/14621 |
| | | | 257/443 |
| 2015/0243694 A1 | 8/2015 | Ihara | |
| 2016/0079288 A1 | 3/2016 | Choi et al. | |
| 2016/0204143 A1 * | 7/2016 | Lee | .................... H01L 27/1463 |
| | | | 257/446 |
| 2017/0062496 A1 * | 3/2017 | Lai | ...................... H01L 27/1464 |
| 2017/0133414 A1 * | 5/2017 | Chiang | ............ H01L 27/14689 |
| 2017/0278893 A1 | 9/2017 | Cheng et al. | |
| 2018/0130834 A1 | 5/2018 | Lee | |
| 2018/0204862 A1 | 7/2018 | Chen et al. | |
| 2018/0286899 A1 | 10/2018 | Muramatsu et al. | |
| 2019/0043901 A1 | 2/2019 | Honda et al. | |
| 2019/0157322 A1 | 5/2019 | Li et al. | |

OTHER PUBLICATIONS

Notice of Allowanced dated Jan. 15, 2020 for U.S. Appl. No. 16/113,066.

Non-Final Office Action dated Sep. 3, 2020 for U.S. Appl. No. 16/815,409.

Notice of Allowance dated Dec. 1, 2020 for U.S. Appl. No. 16/815,409.

* cited by examiner

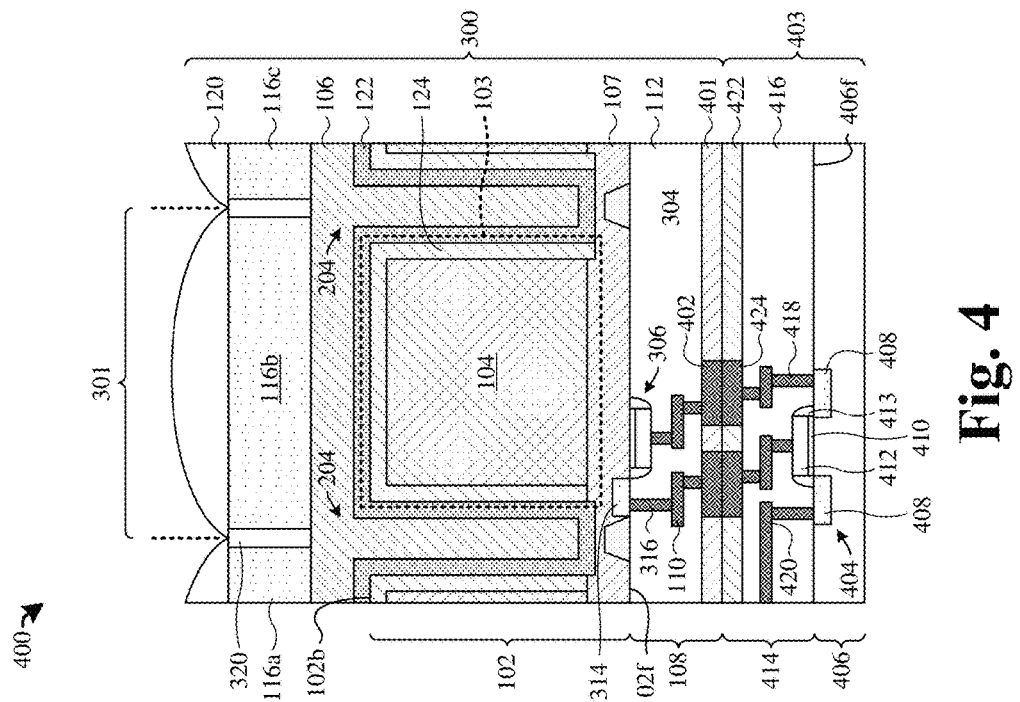
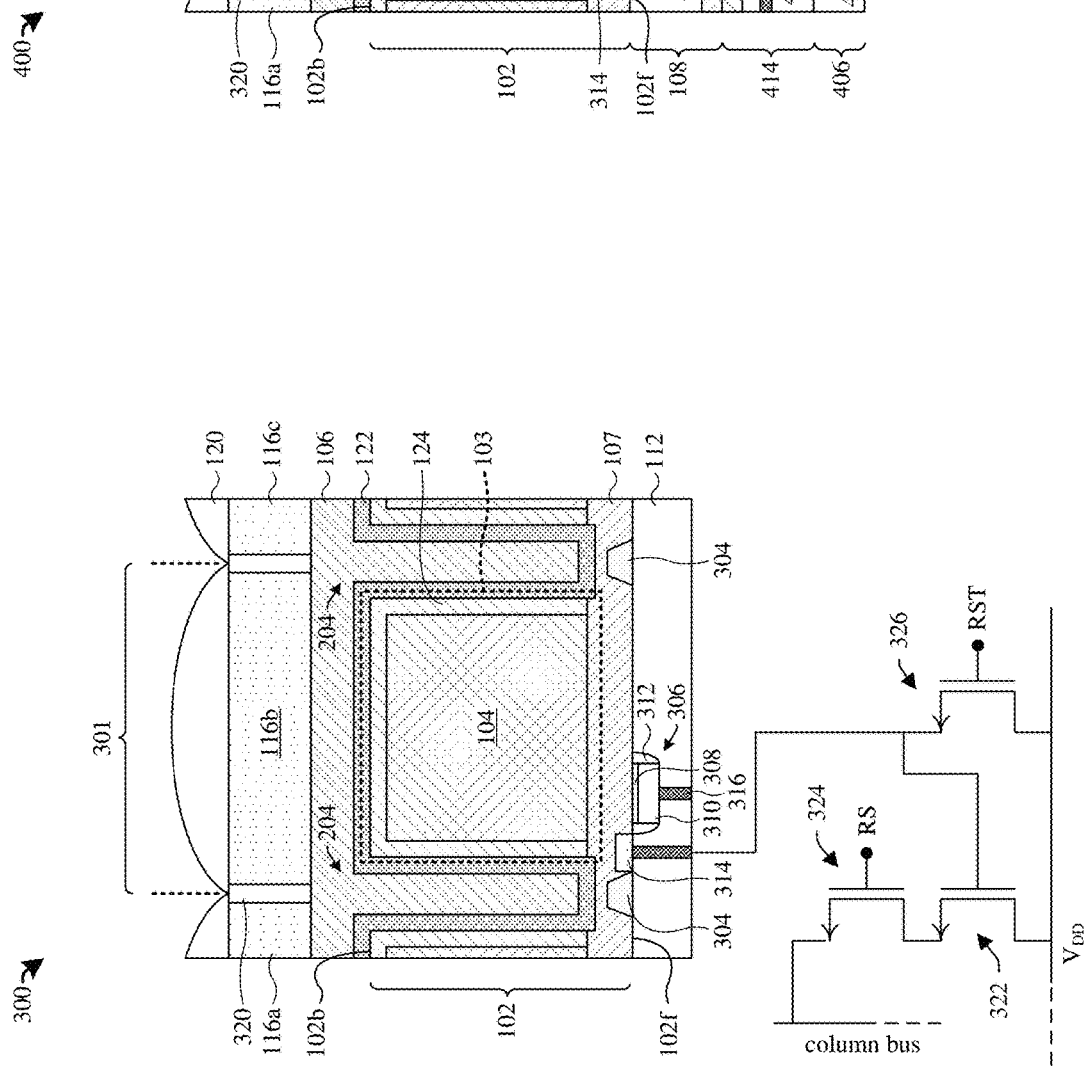
Fig. 4
Fig. 3

IMAGE SENSOR HAVING IMPROVED FULL WELL CAPACITY AND RELATED METHOD OF FORMATION

REFERENCE TO RELATED APPLICATIONS

This Application is a Continuation of U.S. application Ser. No. 16/815,409, filed on Mar. 11, 2020, which is a Divisional of U.S. application Ser. No. 16/113,066, filed on Aug. 27, 2018 (now U.S. Pat. No. 10,658,410, issued on May 19, 2020). The contents of the above-referenced Patent Applications are hereby incorporated by reference in their entirety.

BACKGROUND

Digital cameras and optical imaging devices employ image sensors. Image sensors convert optical images to digital data that may be represented as digital images. An image sensor typically includes an array of pixel sensors, which are unit devices for the conversion of an optical image into electrical signals. Pixel sensors often manifest as charge-coupled devices (CCDs) or complementary metal oxide semiconductor (CMOS) devices. However, CMOS pixel sensors have recently received more attention. Relative to CCD pixel sensors, CMOS pixel sensors provide lower power consumption, smaller size, and faster data processing. Further, CMOS pixel sensors provide a direct digital output of data, and generally have a lower manufacturing cost compared with CCD pixel sensors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3 illustrates a cross-sectional view of some embodiments of a back-side illumination CMOS (BSI-CMOS) image sensor comprising a second doped region disposed between a first doped region and a dielectric layer to improve full well capacity.

FIG. 4 illustrates a cross-sectional view of some embodiments of a stacked CMOS image sensor comprising the back-side illumination CMOS (BSI-CMOS) image sensor of FIG. 3 coupled to a second integrated chip (IC).

DETAILED DESCRIPTION

Figure 1:
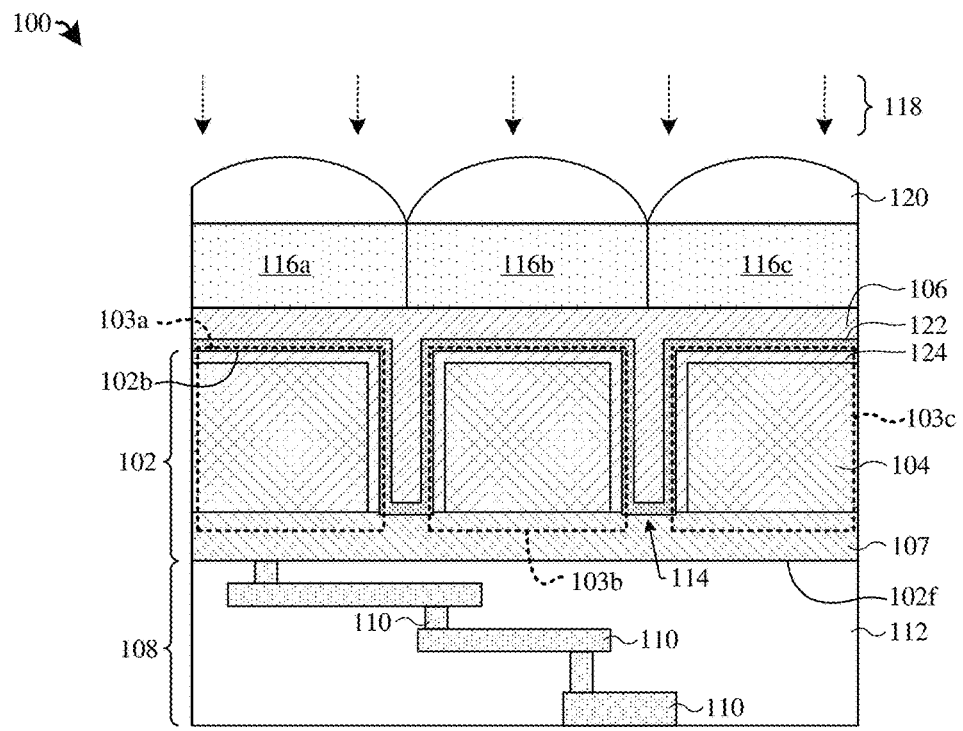
FIG. 1 illustrates a cross-sectional view of some embodiments of a complementary metal-oxide-semiconductor (CMOS) image sensor comprising second doped regions disposed between first doped regions and a dielectric layer to improve full well capacity.

The present disclosure will now be described with reference to the drawings wherein like reference numerals are used to refer to like elements throughout, and wherein the illustrated structures are not necessarily drawn to scale. It will be appreciated that this detailed description and the corresponding figures do not limit the scope of the present disclosure in any way, and that the detailed description and figures merely provide a few examples to illustrate some ways in which the inventive concepts can manifest themselves.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Many portable electronic devices (e.g., cameras, cellular telephones, etc.) include an image sensor for capturing images. One example of such an image sensor is a complementary metal-oxide-semiconductor (CMOS) image sensor including an array of active pixel sensors. Each of the active pixel sensors comprises a photodetector disposed in a semiconductor substrate. The photodetector comprises a p-n junction that exists between a first doped region, which has a first doping type (e.g., n-type doping), and second doped region, which has a second doping type (e.g., p-type doping) opposite the first doping type.

In the case of the CMOS image sensor, device scaling may reduce the dimensions of the first doped region. However, reducing the dimensions of the first doped region makes it more difficult to control a profile of the first doped region when utilizing an ion implantation process that implants ions into a front-side of the semiconductor substrate to form the first doped region. Thus, the full well capacity (e.g., the amount of charge a photodetector can accumulate before saturation) of the photodetector may be reduced due to the ion implantation process undesirably reducing the size of the first doped region. Reducing the full well capacity of the photodetector may negatively affect the performance of the CMOS image sensor by, for example, reducing the high dynamic range of the active pixel sensors.

In addition, deep trench isolation (DTI) structures are often arranged between adjacent first doped regions to isolate neighboring photodetectors. Due to the difficulty in controlling the profile of the first doped regions, some first doped regions may contact the DTI structures (e.g., due to the size of the first doped region being undesirably increased by the ion implantation process). Due to defects along an interface (e.g., silicon (Si)—silicon dioxide ($SiO_2$) interface traps) between the DTI structure and the semiconductor substrate, the DTI structures may generate noise signals that increase dark current and/or white pixel numbers. One possible solution to reduce these noise signals is to arrange a high-k dielectric layer between the DTI structures and the semiconductor substrate. However, this may increase manufacturing complexities (e.g., additional deposition processes, photolithography processes, etching processes, etc.), and thus increase the cost to manufacture the CMOS image sensor.

In various embodiments, the present disclosure is directed toward a CMOS image that uses a doped epitaxial layer to control a profile of a first doped region to improve full well capacity. In some embodiments, the CMOS image sensor has a photodetector having a first doped region disposed in a semiconductor substrate. The dielectric layer is disposed over the semiconductor substrate and comprises a DTI structure that extends into the semiconductor substrate on a side of the first doped region. An epitaxial layer is arranged between the dielectric layer and the semiconductor substrate. The second doped region is disposed in the semiconductor substrate and separates the epitaxial layer from the first doped region. In addition, the epitaxial layer comprises a dopant having an opposite doping type than the first doped region.

Because the epitaxial layer comprises a dopant having an opposite doping type as the first doped region and because the epitaxial layer is disposed between the dielectric layer and the semiconductor substrate, the dopant can be driven from the epitaxial layer into the semiconductor substrate to form the second doped region. Driving the dopant of the epitaxial layer into the semiconductor substrate to form the second doped region provides greater control over the profile of the first doped region than forming the first doped region with an ion implantation process that implants ions into a front-side of the semiconductor substrate. Thus, the size of the first doped region may be increased; thereby improving performance of the CMOS image sensor by increasing the full well capacity of the photodetector. In addition, the second doped region may isolate (e.g., by p-n junction isolation) the first doped region from the DTI structures. Thus, without increasing manufacturing complexities, dark current performance and/or white pixel numbers of the CMOS image sensor may be improved by preventing the noise signals generated by the DTI structures (e.g., Si—$SiO_2$ interface traps) from being collected by the photodetector. Accordingly, the cost to manufacture the CMOS image sensor may be reduced.

FIG. 1 illustrates a cross-sectional view of some embodiments of a complementary metal-oxide-semiconductor (CMOS) image sensor 100 comprising second doped regions disposed between first doped regions and a dielectric layer to improve full well capacity.

As shown in FIG. 1, the CMOS image sensor 100 comprises a semiconductor substrate 102 having a plurality of photodetectors 103a-103c. In some embodiments, the plurality of photodetectors 103a-103c comprises a first photodetector 103a, a second photodetector 103b, and a third photodetector 103c. The photodetectors 103a-103c are configured to convert incident radiation 118 (e.g., photons) into an electrical signal.

Each of the photodetectors 103a-103c comprises a first doped region 104. In some embodiments, the first doped region 104 may comprise a region of the semiconductor substrate 102 having a first doping type (e.g., n-type doping). In further embodiments, each of the photodetectors 103a-103c comprises a p-n junction that exists between the first doped region 104 and a second doped region 124 having a second doping type (e.g., p-type doping) opposite the first doping type. In yet further embodiments, the photodetectors 103a-103c may be disposed in the semiconductor substrate 102 in an array comprising rows and/or columns.

A well region 107 is disposed in the semiconductor substrate 102 near a front-side 102f of the semiconductor substrate. The well region 107 extends into the semiconductor substrate 102 from the front-side 102f of the semiconductor substrate 102 to a position in the semiconductor substrate 102 disposed between the front-side 102f of the semiconductor substrate 102 and a back-side 102b of the semiconductor substrate 102 opposite the front-side 102f of the semiconductor substrate 102. In some embodiments, the well region 107 comprises the second doping type (e.g., p-type doping).

A dielectric layer 106 is disposed over the semiconductor substrate 102. Further, a plurality of regions of the dielectric layer 106 respectively extend into the semiconductor substrate 102 between the photodetectors 103a-103c. In some embodiments, the dielectric layer 106 is disposed over the back-side 102b of the semiconductor substrate 102. In further embodiments, the back-side 102b of the semiconductor substrate 102 opposes an interconnect structure 108 comprising a plurality of conductive features 110 (e.g., conductive lines, conductive vias, contact pads, etc.) that are disposed in an interlayer dielectric (ILD) layer 112. In further embodiments, the dielectric layer 106 may comprise an oxide, a nitride, or some other dielectric material. In further embodiments, the dielectric layer 106 is a continuous layer that extends over the back-side 102b of the semiconductor substrate 102 and into the semiconductor substrate through the back-side 102b of the semiconductor substrate 102.

Deep trench isolation (DTI) structures 114 are disposed in the semiconductor substrate 102. The DTI structures 114 comprise the regions of the dielectric layer 106 that extend into the semiconductor substrate 102 between the photodetectors 103a-103c, respectively. The DTI structures 114 are configured to isolate (e.g., noise signals) neighboring photodetectors 103a-103c. In some embodiments, the DTI structures 114 may be back-side deep trench isolation (BDTI) structures that vertically extend from the back-side 102b of the semiconductor substrate 102 to locations in the semiconductor substrate 102. In further embodiments, the DTI structures 114 extend into the well region 107. In other embodiments, the DTI structures 114 have lower surfaces that are disposed between the well region 107 and the back-side 102b of the semiconductor substrate 102.

A plurality of color filters 116a-116c are disposed over the dielectric layer 106. The plurality of color filters 116a-116c are respectively to transmit specific wavelengths of incident radiation 118. For example, a first color filter 116a (e.g., a red color filter) may transmit light having wavelengths in a first range, a second color filter 116b (e.g., a green color filter) may transmit light having wavelengths in a second range different than the first range, and a third color filter 116c (e.g., a blue color filter) may transmit light having wavelengths in a third range different than the first and second range. A plurality of micro-lenses 120 are disposed over the plurality of color filters 116a-116c. Respective micro-lenses 120 are aligned laterally with the color filters 116a-116c and overlie the photodetectors 103a-103c. The micro-lenses 120 are configured to focus the incident radiation 118 (e.g., light) towards the photodetectors 103a-103c.

An epitaxial layer 122 is disposed between the dielectric layer 106 and the semiconductor substrate 102 and between the DTI structures 114 and the semiconductor substrate 102. In some embodiments, the epitaxial layer 122 separates the dielectric layer 106 from the back-side 102b of the semiconductor substrate 102. In some embodiments, the epitaxial layer 122 separates a lower surface and sidewalls of the DTI structures 114 from the semiconductor substrate 102. In further embodiments, the epitaxial layer 122 is a continuous layer, and continuously separates the DTI structures 114 from the semiconductor substrate 102 and continuously separates the dielectric layer 106 from the back-side 102b of the semiconductor substrate 102. In yet further embodiments, the epitaxial layer 122 may continuously contact the back-side 102b of the semiconductor substrate 102, lower surfaces of the DTI structures 114, and sidewalls of the DTI structures 114.

Further, the epitaxial layer 122 comprises a dopant having an opposite doping type (e.g., p-type doping) as the first doped region 104. In some embodiments, the dopant may be, for example, boron (B), carbon (C), phosphorous (P), some other doping species, or a combination of the forgoing. In further embodiments, the epitaxial layer 122 has the same doping type as the well region 107. In yet further embodiments, the epitaxial layer 122 is doped silicon.

Second doped regions 124 are disposed in the semiconductor substrate 102 between the epitaxial layer 122 and the first doped regions 104, respectively. In some embodiments, the second doped regions 124 have sidewalls that extend from the back-side 102b of the semiconductor substrate 102 into the well region 107. In further embodiments, each of the second doped regions 124 continuously separate the first doped region 104 of one of the photodetectors 103a-103c from the DTI structures 114 and from the dielectric layer 106. In yet further embodiments, each of the second doped regions 124 may continuously contact the first doped region 104 of the one of the photodetectors 103a-103c, a lower surface of the epitaxial layer 122, and sidewalls of the epitaxial layer 122. In various embodiments, each of the second doped regions 124 conformally line the lower surface of the epitaxial layer 122 and the sidewalls of the epitaxial layer 122. In some embodiments, the second doped regions 124 are formed by dopants (e.g., boron (B), carbon (C), etc.) diffusing from the epitaxial layer 122 into the semiconductor substrate 102. In such embodiments, the second doped regions 124 comprise the same doping type (e.g., p-type doping) as the epitaxial layer 122.

The second doped regions 124 isolate (e.g., by p-n junction isolation) the first doped region 104 of the photodetectors 103a-103c, respectively, from the DTI structures 114 and the dielectric layer 106. Thus, without increasing manufacturing complexities (e.g., additional deposition processes, photolithography processes, etching processes, etc.), the second doped regions 124 may improve dark current performance and/or white pixel numbers of the CMOS image sensor 100 by preventing noise signals caused by the DTI structures 114 (e.g., Si—SiO$_2$ interface traps) and/or the dielectric layer 106 from being collected by photodetectors 103a-103c. Accordingly, the cost to manufacture the CMOS image sensor 100 may be reduced.

Figure 2A:
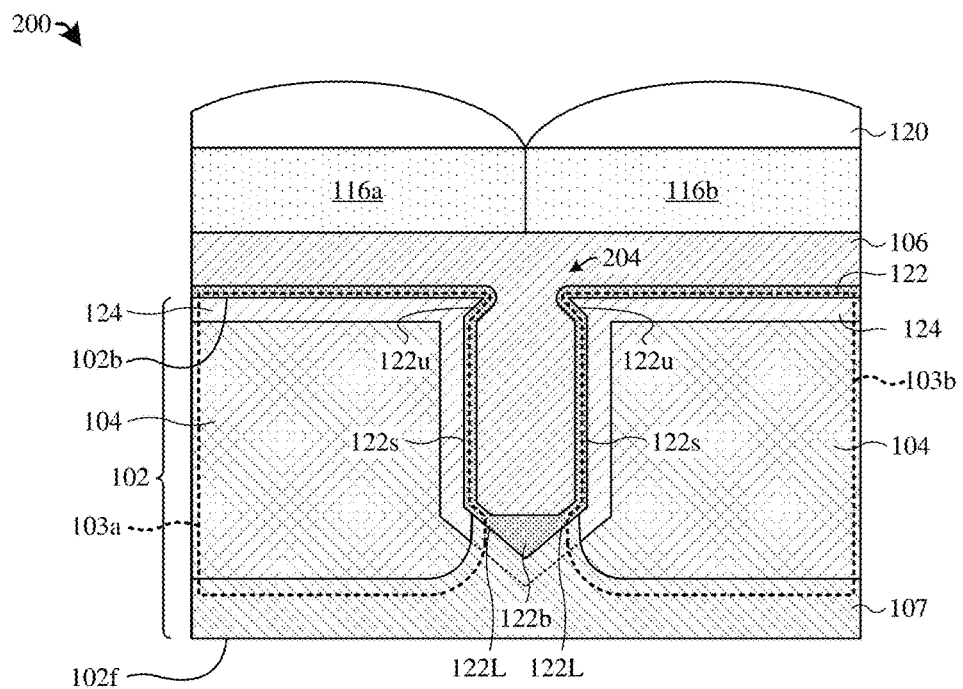
FIGS. 2A-2C illustrate cross-sectional views of various embodiments of an integrated chip (IC) comprising the CMOS image sensor of FIG. 1.
Figure 2B:
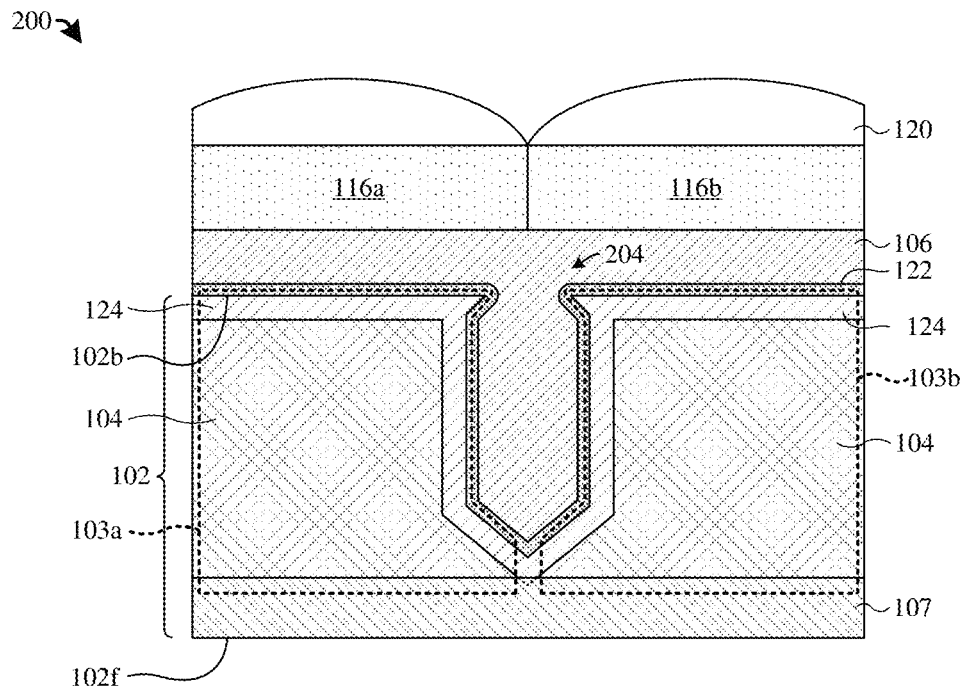
Figure 2C:
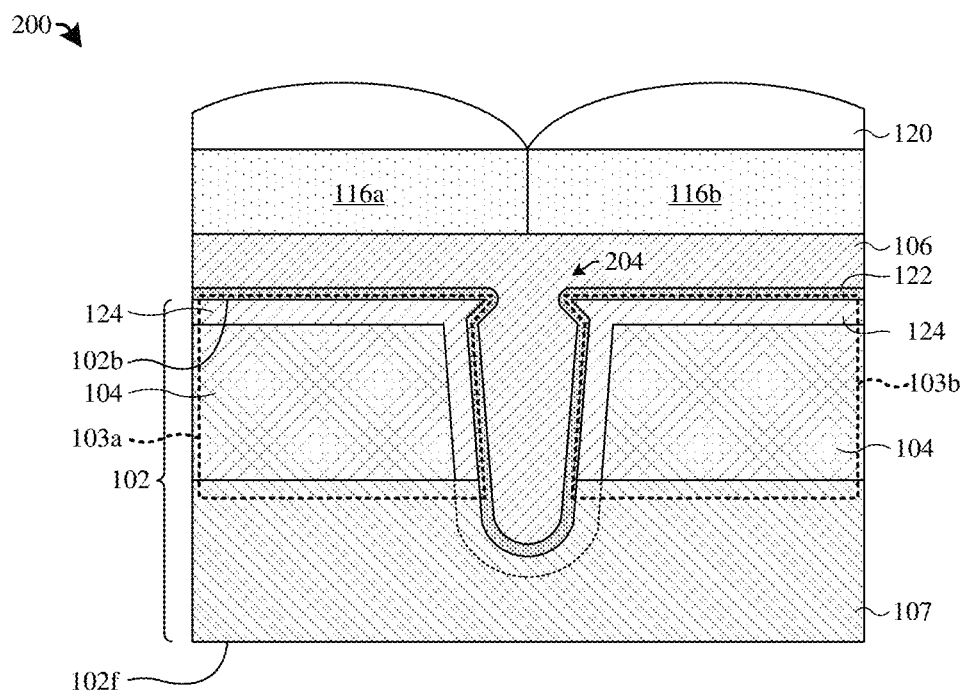

FIGS. 2A-2C illustrate cross-sectional views of some embodiments of an integrated chip (IC) 200 comprising the CMOS image sensor 100 of FIG. 1.

As shown in FIG. 2A, the first photodetector 103a and the second photodetector 103b are disposed in the semiconductor substrate 102 and laterally spaced from one another. The first photodetector 103a and the second photodetector 103b each comprise a first doped region 104. In some embodiments, the first doped region 104 of the first photodetector 103a and the first doped region 104 of the second photodetector 103b are discrete regions of the semiconductor substrate 102 comprising the first doping type.

A back-side deep trench isolation (BDTI) structure 204 is disposed in the semiconductor substrate 102. The BDTI structure 204 extends from the back-side 102b of the semiconductor substrate 102 to a position between the first photodetector 103a and the second photodetector 103b. The BDTI structure 204 comprises a region of the dielectric layer 106 that extends into the semiconductor substrate 102 from the back-side 102b of the semiconductor substrate 102 between the first photodetector 103a and the second photodetector 103b.

The epitaxial layer 122 separates the BDTI structure 204 and the dielectric layer 106 from the semiconductor substrate 102. In some embodiments, the epitaxial layer 122 has angled lower surfaces 122L that respectively extend outward from one another in opposite lateral directions and vertically towards the back-side 102b of the semiconductor substrate 102. Further, the epitaxial layer 122 has substantially vertical sidewalls 122s that extend from the angled lower surfaces 122L towards the back-side 102b of the semiconductor substrate 102, respectively. Moreover, the epitaxial layer 122 has angled upper sidewalls 122u that extend from the substantially vertical sidewalls 122s inward in opposite lateral directions toward one another and vertically to the back-side 102b of the semiconductor substrate 102, respectively. In some embodiments, the angled upper sidewalls 122u extend inward less than the angled lower surfaces 122L extend outward.

In some embodiments, the epitaxial layer 122 comprises doped silicon having the same doping type (e.g., p-type doping) as the well region 107. In such embodiments, the epitaxial layer 122 may comprise a dopant, for example, boron (B), carbon (C), some other doping species, or a combination of the foregoing. In further embodiments, the epitaxial layer 122 may have a doping concentration between about $1 \times 10^{18}$ cm$^3$ and about $2 \times 10^{20}$ cm$^3$. In further embodiments, the epitaxial layer 122 may have a thickness between about 1 nanometer (nm) and about 30 nm. More specifically, the epitaxial layer 122 may have a thickness between about 1 nm and about 10 nm. In further embodiments, the epitaxial layer 122 has a first thickness along the substantially vertical sidewalls 122s, the angled upper sidewalls 122u, and the angled lower surfaces 122L, and a second thickness greater than the first thickness along a bottom portion 122b of the epitaxial layer 122.

In some embodiments, the angled lower surfaces 122L of the epitaxial layer 122 contact the well region 107. In further embodiments, the angled lower surfaces 122L, of the epitaxial layer 122 contact a portion of the well region 107 that extends vertically between the first photodetector 103a and the second photodetector 103b, In yet further embodiments, the angled lower surfaces 122L, of the epitaxial layer 122 may respectively extend outward beyond sidewalls of the portion of the well region 107 that extends vertically between the first photodetector 103a and the second photodetector 103b.

Second doped regions 124 are disposed in the semiconductor substrate 102 between the epitaxial layer 122 and the first doped region 104 of the first photodetector 103a and the epitaxial layer 122 and the first doped region 104 of the second photodetector 103b, respectively. In some embodiments, the second doped regions 124 extend into the semiconductor substrate 102 from the back-side 102b of the semiconductor substrate 102 along the angled upper sidewalk 122u of the epitaxial layer 122, along the substantially vertical sidewalls 122s of the epitaxial layer 122, and along portions of the angled lower surfaces 122L of the epitaxial layer 122 respectively. In such embodiments, the second doped regions 124 may conformally line the epitaxial layer 122. In further embodiments, the second doped regions 124 extend laterally along the back-side 102b of the semiconductor substrate 102, respectively, such that the second doped regions 124 separate the back-side 102b of the semiconductor substrate 102 from the first doped region 104 of the first photodetector 103a and from the first doped region 104 of the second photodetector 103b, respectively. In such embodiments, the second doped regions 124 may conformally extend along the epitaxial layer 122 in lateral directions near the back-side 102b of the semiconductor substrate 102.

In some embodiments, the second doped regions 124 may extend below the angled lower surfaces 122L of the epitaxial layer 122 into the well region 107, respectively. In such embodiments, portions of the second doped regions 124 that extend into the well region 107 (e.g., shown in phantom) may have a higher doping concentration than the well region 107. In further such embodiments, the portions of second doped regions 124 that extend into the well region 107 (e.g., shown in phantom) may have a higher doping concentration than portions of the second doped regions 124 that are disposed outside of the well region 107.

In further embodiments, the second doped regions 124 are formed by a dopant (e.g., boron (B), carbon (C), etc.) being driven from the epitaxial layer 122 into the semiconductor substrate 102. In such embodiments, the second doped regions 124 comprise the same doping type (e.g., p-type doping) as the epitaxial layer 122. In further embodiments, the second doped regions 124 may have a thickness less than about 50 nm. In yet further embodiments, the second doped regions 124 may have a doping concentration between about $1 \times 10^{18}$ cm$^3$ and about $2 \times 10^{20}$ cm$^3$.

The second doped regions 124 isolate (e.g., by p-n junction isolation) the first doped region 104 of the first photodetector 103a from the BDTI structure 204 and the first doped region 104 of the second photodetector 103b from the BDTI structure 204, respectively. Thus, without increasing manufacturing complexities (e.g., additional deposition processes, photolithography processes, etching processes, etc.), the second doped regions 124 may improve dark current performance and/or white pixel numbers of the CMOS image sensor 100 by preventing noise signals caused by the BDTI structure 204 (e.g., Si—SiO$_2$ interface traps) and/or the dielectric layer 106 from being collected by the first photodetector 103a and/or the second photodetector 103b, respectively. Accordingly, the cost to manufacture the IC 200 may be reduced.

As shown in FIG. 2B, the epitaxial layer 122 is conformally disposed between the dielectric layer 106 and the semiconductor substrate 102, such that the epitaxial layer 122 is conformally disposed between the BDTI structure 204 and the semiconductor substrate 102 and conformally disposed between the dielectric layer 106 and the back-side 102b of the semiconductor substrate 102. In some embodiments, the epitaxial layer 122 has angled lower surfaces 122L that are disposed between the back-side 102b of the semiconductor substrate 102 and the well region 107. Although the epitaxial layer 122 has angled lower surfaces 122L that are disposed between the back-side 102b of the semiconductor substrate 102 and the well region 107, the second doped regions 124 may still extend into the well region 107. In other embodiments, the second doped regions 124 may not extend into the well region 107.

As shown in FIG. 2C, the epitaxial layer 122 extends from the back-side 102b of the semiconductor substrate 102 into the well region 107, such that sidewalls of the epitaxial layer 122 extend into the well region 107. In some embodiments, the epitaxial layer 122 has a substantially rounded lower surface disposed beneath the BDTI structure 204. Further, the epitaxial layer 122 has lower angled sidewalk that extend from the substantially rounded lower surface outward in opposite lateral directions from one another and vertically toward the back-side 102b of the semiconductor substrate 102. Moreover, the epitaxial layer 122 has angled upper sidewalk that extend from the angled lower sidewalls inward in opposite lateral directions toward one another and vertically to the back-side 102b of the semiconductor substrate 102. In some embodiments, the angled upper sidewalls extend inward at a greater angle than the lower angled sidewalls extend outward. In further embodiments, the lower angled sidewalls of the epitaxial layer 122 contact the second doped regions 124 and the well region 107. In such embodiments, the rounded lower surface of the epitaxial layer 122 may contact the well region 107.

FIG. 3 illustrates a cross-sectional view of some embodiments of a back-side illumination CMOS (BSI-CMOS) image sensor 300 comprising a second doped region disposed between a first doped region and a dielectric layer to improve full well capacity.

The BSI-CMOS image sensor 300 comprises a pixel sensor 301 (e.g., an active pixel sensor). The pixel sensor 301 comprises a photodetector 103 disposed in a semiconductor substrate 102. In some embodiments, the semiconductor substrate 102 may comprise, for example, a bulk silicon substrate, a silicon-on-insulator (SOI) substrate, or some other semiconductor substrate. In further embodiments, the photodetector 103 comprises a first doped region 104 having a first doping type (e.g., n-type doping). In yet further embodiments, a well region 107 having a second doping type (e.g., p-type doping) is disposed in the semiconductor substrate 102 near a front-side 102f of the semiconductor substrate 102.

A transfer transistor 306 is disposed over the front-side 102f of the semiconductor substrate 102. The transfer transistor 306 comprises a gate dielectric layer 308 disposed over the front-side 102f of the semiconductor substrate 102, and a gate electrode 310 disposed on the gate dielectric layer 308. In some embodiments, sidewall spacers 312 are disposed on opposing sides of the gate electrode 310 and opposing sidewalls of the gate dielectric layer 308. The transfer transistor 306 is configured to transfer accumulated charge in the first doped region 104 to a floating diffusion node 314. In further embodiments, the transfer transistor 306 may be isolated from adjacent transfer transistors (not shown) by one or more isolation structures 304 (e.g., shallow trench isolation (STI) structures) disposed in the well region 107 on opposing sides of the transfer transistor 306. The one or more isolation structures 304 may comprise a dielectric material, for example, an oxide (e.g., silicon dioxide (SiO$_2$)), a nitride, an oxy-nitride, or the like.

An ILD layer 112 is disposed on the front-side 102f of the semiconductor substrate 102. In some embodiments, the ILD layer 112 comprises one or more ILD materials. In further embodiments, the ILD layer 112 may comprise one or more of a low-k dielectric layer (e.g., a dielectric with a dielectric constant less than about 3.9), an ultra-low-k dielectric layer, or an oxide (e.g., $SiO_2$). Conductive contacts 316 are disposed in the ILD layer 112. The conductive contacts 316 extend from the gate electrode 310 and the floating diffusion node 314 to one or more metal wire layers (not shown). In various embodiments, the conductive contacts 316 may comprise, for example, copper, tungsten, or some other conductive material.

A dielectric layer 106 is disposed over a back-side 102b of the semiconductor substrate 102. A plurality of regions of the dielectric layer 106 extend from the back-side 102b of the semiconductor substrate 102 into the semiconductor substrate 102 on opposing sides of the photodetector 103. The dielectric layer 106 vertically separates a plurality of color filters 116a-116c from the back-side 102b of the semiconductor substrate 102. In some embodiments, the plurality of color filters 116a-116c may be arranged in a grid structure 320 disposed over the dielectric layer 106. In some embodiments, the grid structure 320 may comprise a stacked grid having a metal framework surrounded by a dielectric material. In further embodiments, the dielectric layer 106 and the dielectric material of the grid structure 320 may comprise a same dielectric material (e.g., $SiO_2$).

A plurality of micro-lenses 120 are disposed over the plurality of color filters 116a-116c, respectively. In some embodiments, the micro-lenses 120 have substantially planar bottom surfaces contacting the plurality of color filters 116a-116c, respectively. In further embodiments, the micro-lenses 120 have curved upper surface. In such embodiments, the curved upper surface of one of the micro-lenses 120 is configured to focus incident radiation towards the underlying photodetector 103.

Back-side deep trench isolation (BDTI) structures 204 are disposed in the semiconductor substrate 102 and extend from the back-side 102b of the semiconductor substrate 102 into the semiconductor substrate 102 on opposite sides of the photodetector 103. The BDTI structures 204 comprise the plurality of regions of the dielectric layer 106 that extend into the semiconductor substrate 102 on opposing sides of the photodetector 103, respectively. In some embodiments, the BDTI structures 204 comprise, for example, an oxide (e.g., $SiO_2$), a nitride, an oxy-nitride, or the like.

An epitaxial layer 122 is disposed between the dielectric layer 106 and the semiconductor substrate 102, such that the BDTI structures 204 and the dielectric layer 106 are separated from the semiconductor substrate 102 by the epitaxial layer 122. In some embodiments, the epitaxial layer 122 may have an opposite doping type as the first doped region 104. In further embodiments, the epitaxial layer 122 may comprise silicon (Si) and one or more dopants, for example, boron (B), phosphorous (P), carbon (C), some other suitable dopant, or a combination of the forgoing. In further embodiments, the one or more dopants have an opposite doping type (e.g., p-type doping) than the first doped region 104.

A second doped region 124 is disposed in the semiconductor substrate 102 between the first doped region 104 and the epitaxial layer 122. In some embodiments, the second doped region 124 extends vertically along sidewalls of the epitaxial layer 122 and laterally along a lower surface of the epitaxial layer 122. In further embodiments, the second doped region 124 comprises the same doping type (e.g., p-type doping) as the well region 107. In further embodiments, the second doped region 124 comprises the same one or more dopants (e.g., boron (B), carbon (C), etc.) as the epitaxial layer 122. In further embodiments, the second doped region 124 comprises a different doping concentration than the well region 107. In other embodiments, the second doped region 124 comprise a substantially similar doping concentration as the well region 107.

During operation of the BSI-CMOS image sensor 300, incident radiation is focused by one of the micro-lens 120 to the underlying photodetector 103. When incident radiation of sufficient energy strikes the photodetector 103, it generates an electron-hole pair that produces a photocurrent. The transfer transistor 306 controls charge transfer from the photodetector 103 to the floating diffusion node 314. If the charge level is sufficiently high in the floating diffusion node 314 (or if some predetermined time for collector charge is met), a source follower transistor 322 is activated and charges are selectively output according to operation of a row select transistor 324 used for addressing. A reset transistor 326 is configured to reset the photodetector 103 between exposure periods.

FIG. 4 illustrates a cross-sectional view of some embodiments of a stacked CMOS image sensor 400 comprising the back-side illumination CMOS (BSI-CMOS) image sensor 300 of FIG. 3 coupled to a second integrated chip (IC) 403.

As shown in FIG. 4, the BSI-CMOS image sensor 300 comprises an interconnect structure 108 disposed on the front-side 102f of the semiconductor substrate 102. In some embodiments, the interconnect structure 108 comprises an upper passivation layer 401 disposed on the ILD layer 112. A plurality of conductive features 110 (e.g., conductive lines and conductive vias) are disposed in the ILD layer 112 and electrically coupled to the conductive contacts 316. In some embodiments, a plurality of contact pads 402 are disposed in the upper passivation layer 401 and are electrically coupled to the plurality of conductive features 110. In further embodiments, the contact pads 402 may comprise, for example, aluminum, gold, copper, or some other conductive material. In yet further embodiments, the upper passivation layer 401 may comprise, for example, an oxide, a nitride, and oxy-nitride, a polymer, or some other dielectric material.

The second IC 403 comprises a semiconductor device. In some embodiments, the semiconductor device is a metal-oxide-semiconductor field-effect transistor (MOSFET) 404 disposed on a front-side 406f of a second semiconductor substrate 406. In some embodiments, the second semiconductor substrate 406 may comprise, for example, a silicon-on-insulator (SOI) substrate, or some other semiconductor substrate. In further embodiments, the MOSFET 404 comprises a pair of source/drain regions 408 disposed in the second semiconductor substrate 406, a MOSFET gate dielectric layer 410 disposed over the front-side 406f of the second semiconductor substrate 406, and a MOSFET gate electrode 412 disposed on the MOSFET gate dielectric layer 410. In some embodiments, MOSFET sidewall spacers 413 are disposed on opposing sides of the MOSFET gate electrode 412 and opposing sidewalls of the MOSFET gate dielectric layer 410. In yet further embodiments, the second IC 403 is an application-specific integrated circuit (ASIC) configured to process electrical signals received from the BSI-CMOS image sensor 300.

A second IC interconnect structure 414 is disposed over the front-side 406f of the second semiconductor substrate 406. The second IC interconnect structure 414 comprises a second IC ILD layer 416 disposed on the front-side 406f of the second semiconductor substrate 406. In some embodiments, the second IC ILD layer 416 may comprise one or more of a low-k dielectric layer (e.g., a dielectric with a dielectric constant less than about 3.9), an ultra-low-k dielectric layer, or an oxide (e.g., $SiO_2$). A plurality of second IC conductive contacts 418 are disposed in the second IC ILD layer 416. In some embodiments, the second IC conductive contacts 418 extend from the MOSFET gate electrode 412 and the pair of source/drain regions 408 to a plurality of second IC conductive features 420 (e.g., conductive lines and conductive vias) disposed in the second IC ILD layer 416.

In some embodiments, the second IC interconnect structure 414 comprises a second IC upper passivation layer 422 disposed on the second IC ILD layer 416. A plurality of second IC contact pads 424 are disposed in the second IC upper passivation layer 422 and are electrically coupled to the second IC conductive features 420. In further embodiments, the second IC interconnect structure 414 is bonded (e.g., by eutectic bonding, by hybrid bonding, etc.) to the interconnect structure 108, such that the MOSFET 404 is electrically coupled to the BSI-CMOS image sensor 300.

FIGS. 5-13 illustrate a series of cross-sectional views of some embodiments for forming a stacked CMOS image sensor comprising a second doped region disposed between a first doped region and a dielectric layer to improve full well capacity.

Figure 5:
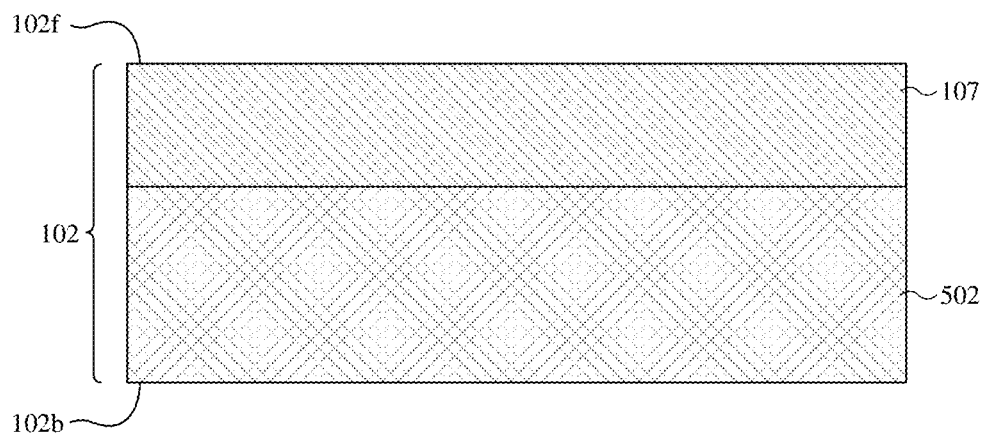
FIGS. 5-13 illustrate a series of cross-sectional views of some embodiments for forming a stacked CMOS image sensor comprising a second doped region disposed between a first doped region and a dielectric layer to improve full well capacity.

As shown in FIG. 5, a doped area 502 is formed in a semiconductor substrate 102. In further embodiments, the doped area 502 is a region of the semiconductor substrate 102 comprising a first doping type (e.g., n-type doping). In yet further embodiments, the doped area 502 may be formed by a blanket ion implantation process (e.g., an unmasked ion implantation) to implant ions into the semiconductor substrate 102. In other embodiments, the doped area 502 may be formed by a selective ion implantation process that utilizes a masking layer (not shown) on a front-side 102f of the semiconductor substrate 102 to selectively implant ions into the semiconductor substrate 102.

Also shown in FIG. 5, a well region 107 is formed in the semiconductor substrate 102. In some embodiments, the well region 107 is a region of the semiconductor substrate 102 having a second doping type (e.g., p-type doping) opposite the first doping type. In further embodiments, the well region 107 is formed in contact with the doped area 502. In yet further embodiments, the well region 107 may be formed by a blanket ion implantation process to implant ions into the semiconductor substrate 102. In other embodiments, the well region 107 may be formed by a selective ion implantation process that utilizes a masking layer (not shown) on the front-side 102f of the semiconductor substrate 102 to selectively implant ions into the semiconductor substrate 102.

Figure 6:
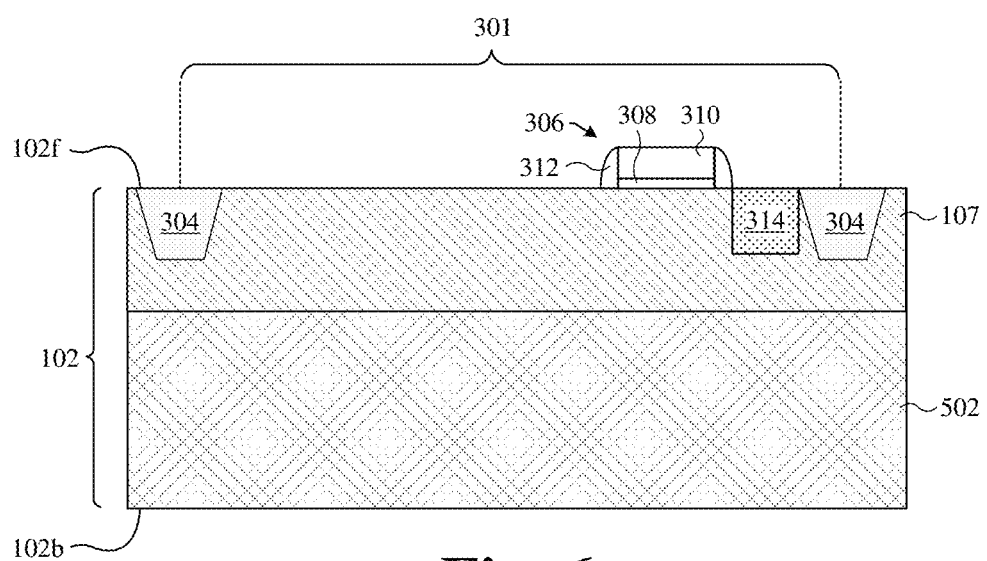

As shown in FIG. 6, isolation structures 304 (e.g., shallow trench isolation (STI) structures) are formed in the semiconductor substrate 102. In some embodiments, the isolation structures 304 may be formed by selectively etching the semiconductor substrate 102 to form a trench in the semiconductor substrate 102, and subsequently filing the trench with a dielectric material. In further embodiments, the semiconductor substrate 102 is selectively etched by forming a masking layer (not shown) over the semiconductor substrate 102, and subsequently exposing the semiconductor substrate 102 to an etchant configured to selectively remove unmasked portions of the semiconductor substrate 102. In further embodiments, the dielectric material may be deposited or grown by, for example, physical vapor deposition (PVD), chemical vapor deposition (CVD), sputtering, thermal oxidation, or some other deposition or growth process. In yet further embodiments, the dielectric material may comprise an oxide (e.g., silicon dioxide ($SiO_2$)), a nitride, a carbide, or the like.

Also shown in FIG. 6, a transfer transistor 306 is formed on a front-side 102f of the semiconductor substrate 102. The transfer transistor 306 may be formed by depositing a gate dielectric film and a gate electrode film over the semiconductor substrate 102. The gate dielectric film and the gate electrode film are subsequently patterned to form a gate dielectric layer 308 and a gate electrode 310, respectively. Further, sidewall spacers 312 may be formed on opposing sidewalls of the gate electrode 310 and opposing sidewalls of the gate dielectric layer 308. In some embodiments, the sidewall spacers 312 may be formed by conformally depositing a nitride onto the front-side 102f of the semiconductor substrate 102 and etching back the nitride using a vertical etch to form the sidewall spacers 312. Moreover, a floating diffusion node 314 is formed in the semiconductor substrate 102. The floating diffusion node 314 is a region of the semiconductor substrate 102 having an opposite doping type than the well region 107. In some embodiments, the floating diffusion node 314 may be formed by a selective ion implantation process that utilizes a masking layer (not shown) on the front-side 102f of the semiconductor substrate 102 to selectively implant ions into the semiconductor substrate 102.

Figure 7:
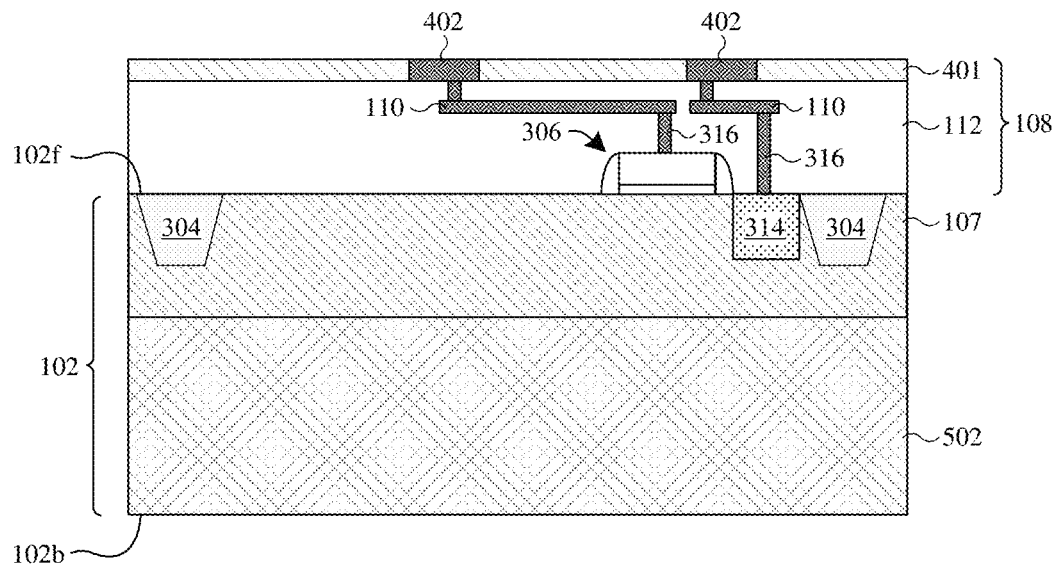

As shown in FIG. 7, an interconnect structure 108 is formed over the front-side 102f of the semiconductor substrate 102. The interconnect structure 108 comprises conductive contacts 316 and a plurality of conductive features 110 (e.g., conductive lines and conductive vias) disposed in an ILD layer 112. In some embodiments, the ILD layer 112, which may comprise one or more dielectric layers, is formed over the front-side 102f of the semiconductor substrate 102. The ILD layer 112 is subsequently etched to form via holes and/or conductive line trenches. The via holes and/or conductive line trenches are then filled with a conductive material (e.g., copper, aluminum, tungsten, etc.) to form the plurality of conductive contacts 316 and the plurality of conductive features 110. In some embodiments, the ILD layer 112 may be deposited or grown by, for example, PVD, CVD, sputtering, thermal oxidation, or some other deposition or growth process. The conductive contacts 316 and conductive features 110 may be formed by, for example, PVD, CVD, electrochemical plating, electroless plating, or some other deposition process.

In further embodiments, the interconnect structure 108 comprises contact pads 402 disposed in an upper passivation layer 401 that is disposed on the ILD layer 112. In some embodiments, the upper passivation layer 401 may be formed on the ILD layer 112, and subsequently etched to form openings in the upper passivation layer 401. The openings are then filled with a conductive material to form the contact pads 402. In some embodiments, the upper passivation layer 401 may be deposited by, for example, PVD, CVD, sputtering, or some other deposition process. The contact pads 402 may be formed by, for example, PVD, CVD, electrochemical plating, electroless plating, or some other deposition process.

Figure 8:
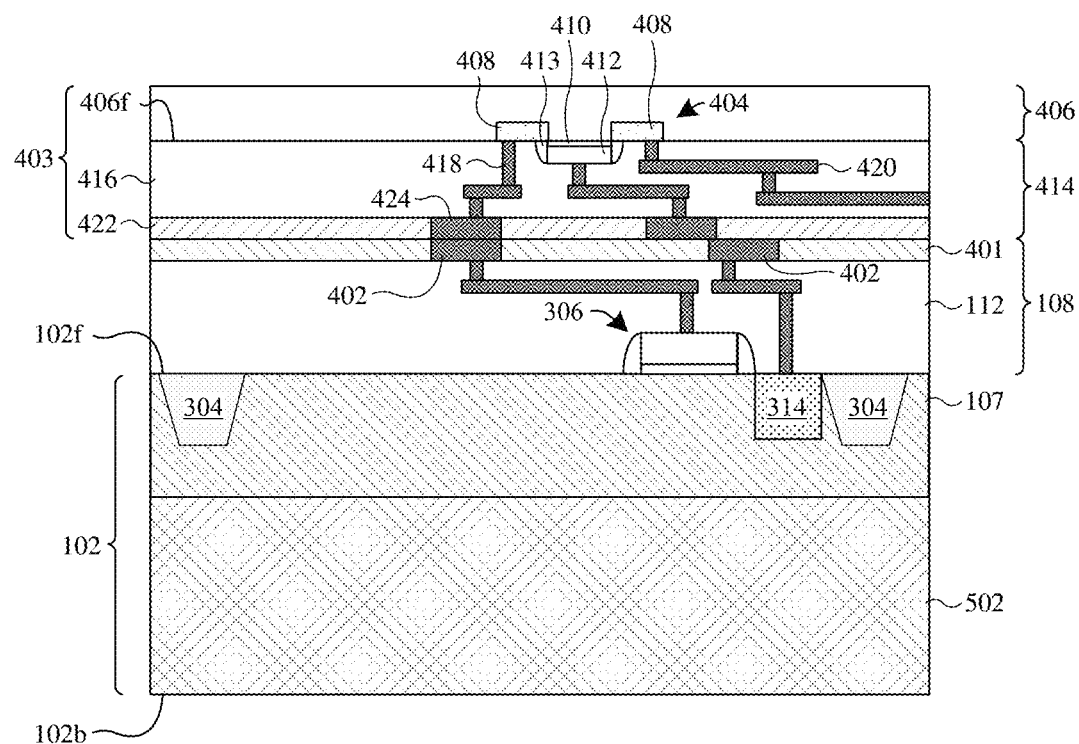

As shown in FIG. 8, the interconnect structure 108 is bonded to a second integrated chip (IC) 403 comprising a second IC interconnect structure 414. In some embodiments, the second IC interconnect structure 414 is formed over a front-side 406f of a second semiconductor substrate 406. Subsequently, the interconnect structure 108 is bonded to the second IC interconnect structure 414 by, for example, eutectic bonding, hybrid bonding, or some other bonding process.

In some embodiments, the second IC 403 comprises a metal-oxide-semiconductor field-effect transistor (MOSFET) 404. The MOSFET 404 is disposed on the front-side 406f of the second semiconductor substrate 406. The MOSFET 404 comprises a MOSFET gate dielectric layer 410 disposed on the front-side 406f of the second semiconductor substrate 406, and a MOSFET gate electrode 412 disposed on the MOSFET gate dielectric layer 410. A pair of source/drain regions 408 are disposed on opposite sides of the MOSFET gate dielectric layer 410. In some embodiments, MOSFET sidewall spacers 413 are disposed on opposing sides of the MOSFET gate electrode 412 and opposing sidewalls of the MOSFET gate dielectric layer 410. In further embodiments, a process for forming the MOSFET 404 may comprise a substantially similar process for forming the transfer transistor 306.

In some embodiments, the second IC interconnect structure 414 comprises a second IC ILD layer 416 disposed on the front-side 406f of the second semiconductor substrate 406. Second IC conductive contacts 418 are disposed in the second IC ILD layer 416. In some embodiments, the second IC conductive contacts 418 extend from the MOSFET gate electrode 412 and the pair of source/drain regions 408 to a plurality of second IC conductive features 420 (e.g., conductive lines and conductive vias) disposed in the second IC ILD layer 416. In some embodiments, the second IC interconnect structure 414 comprises a second IC upper passivation layer 422 disposed on the second IC ILD layer 416. A plurality of second IC contact pads 424 are disposed in the second IC upper passivation layer 422 and electrically coupled to the plurality of second IC conductive features 420. In further embodiments, a process for forming the second IC interconnect structure 414 may comprise a substantially similar process for forming the interconnect structure 108 of the BSI-CMOS image sensor 300.

Figure 9:
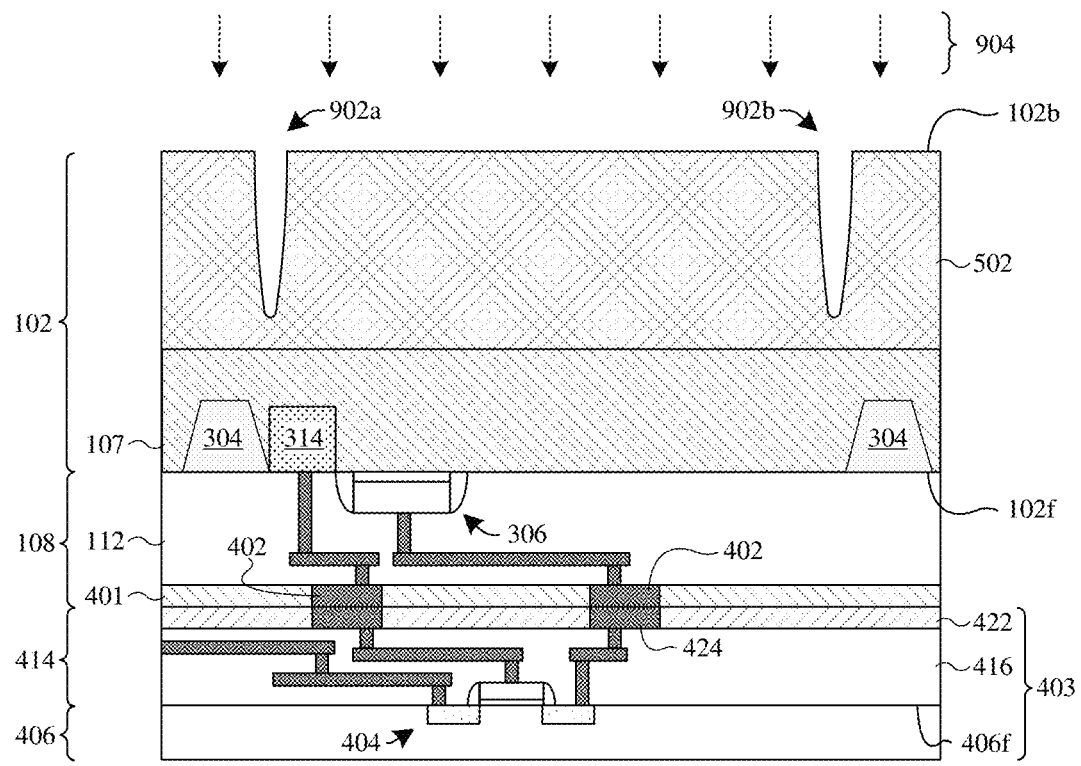

As shown in FIG. 9, the semiconductor substrate 102 is selectively etched to form initial deep trenches 902a-902b in the back-side 102b of the semiconductor substrate 102. In some embodiments, the initial deep trenches 902a-902b extend from the back-side 102b of the semiconductor substrate 102 to first points in the semiconductor substrate 102, respectively, that are disposed over the well region 107 (e.g., between the well region 107 and the back-side 102b of the semiconductor substrate 102). In other embodiments, the initial deep trenches 902a-902b may extend from the back-side 102b of the semiconductor substrate 102 to second points in the semiconductor substrate 102, respectively, that are disposed in the well region 107.

In some embodiments, a process for forming the initial deep trenches 902a-902b comprises forming a masking layer (not shown) on the back-side 102b of the semiconductor substrate 102. The masking layer (not shown) may be formed on the back-side 102b of the semiconductor substrate 102 by flipping (e.g., rotating the semiconductor substrate 180 degrees) the semiconductor substrate 102, such that the masking layer (not shown) may be formed on the back-side 102b of the semiconductor substrate 102. The back-side 102b of the semiconductor substrate 102 is then exposed to a first etchant 904 that removes portions of the semiconductor substrate 102 not exposed by the masking layer to form the initial deep trenches 902a-902b in the semiconductor substrate 102. In some embodiments, the first etchant is diluted hydrofluoric acid (DHF).

Figure 10:
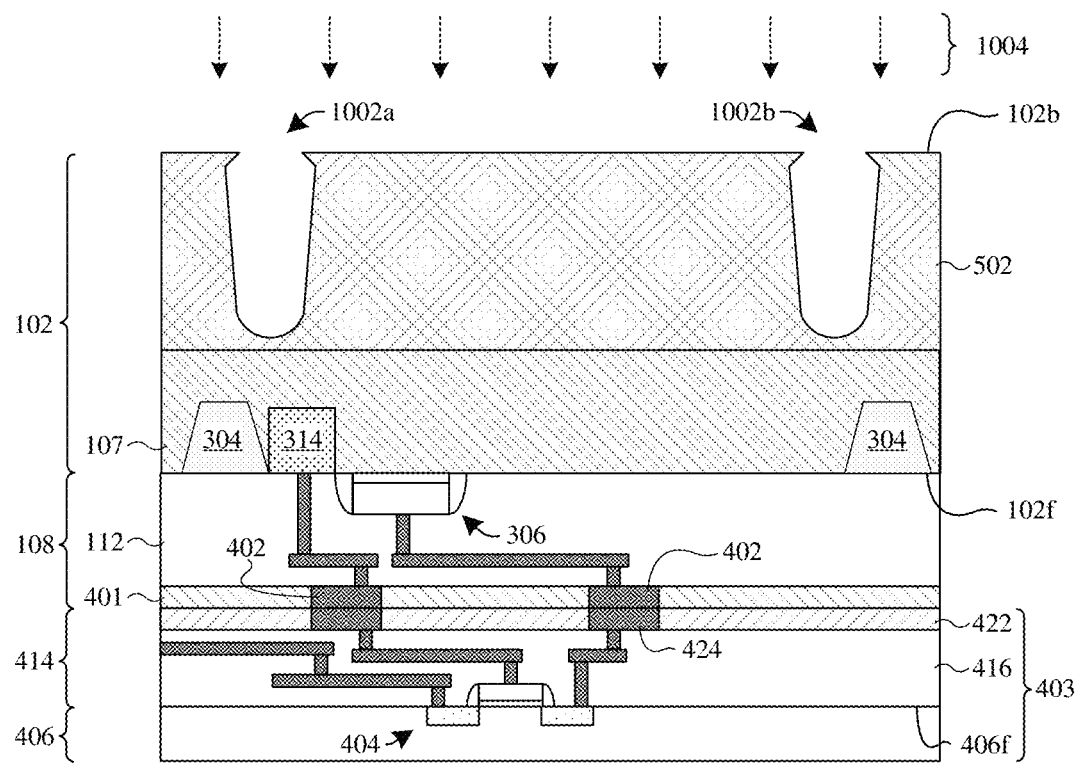

As shown in FIG. 10, the semiconductor substrate 102 is etched to form extended deep trenches 1002a-1002b in the back-side 102b of the semiconductor substrate 102. In some embodiments, the extended deep trenches 1002a-1002b extend from the back-side 102b of the semiconductor substrate 102 to third points in the semiconductor substrate 102, respectively, that are disposed over the well region 107 (e.g., between the well region 107 and the back-side 102b of the semiconductor substrate 102). In such embodiments, the third points may be disposed between the first points and the well region 107. In other embodiments, the extended deep trenches 1002a-1002b may extend to fourth points in the semiconductor substrate 102, respectively, that are disposed in the well region 107. In such embodiments, the fourth points may be disposed between the second points and the front-side 102f of the semiconductor substrate 102.

In some embodiments, the extended deep trenches 1002a-1002b have substantially rounded lower surfaces. In other embodiments, the extended deep trenches 1002a-1002b have angled lower surfaces along the <111> crystal plane of the semiconductor substrate 102. Further, the extended deep trenches 1002a-1002b have lower angled sidewalls that respectively extend from the sustainably rounded lower surfaces outward in opposite lateral directions from one another and vertically toward the back-side 102b of the semiconductor substrate 102. Moreover, the extended deep trenches 1002a-1002b have angled upper sidewalls that respectively extend from the angled lower sidewalls inward in opposite lateral directions toward one another and vertically to the back-side 102b of the semiconductor substrate 102. In some embodiments, the angled upper sidewalls extend inward at a greater angle than the lower angled sidewalls extend outward.

In some embodiments, a process for forming the extended deep trenches 1002a-1002b comprises forming a masking layer (not shown) on the back-side 102b of the semiconductor substrate 102. Subsequently, the back-side 102b of the semiconductor substrate 102 is exposed to a second etchant 1004 that removes portions of the semiconductor substrate 102 not exposed by the masking layer to form the extended deep trenches 1002a-1002b. In some embodiments, the second etchant is tetramethylammonium hydroxide (TMAH).

Figure 11:
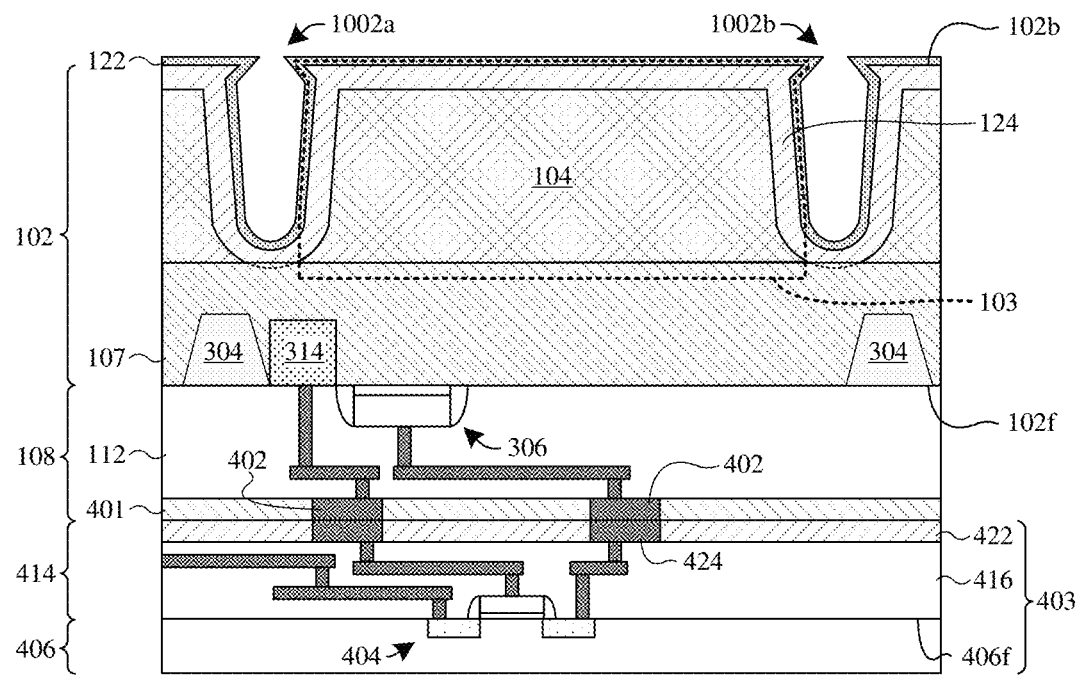

As shown in FIG. 11, an epitaxial layer 122 is formed on the back-side 102b of the semiconductor substrate 102 and lining the extended deep trenches 1002a-1002b. In some embodiments, the epitaxial layer 122 is formed conformally on the back-side of the semiconductor substrate 102 and conformally lining the extended deep trenches 1002a-1002b. In further embodiments, the epitaxial layer 122 comprises silicon (Si) and a dopant (e.g., boron (B), carbon (C), etc.) having the second doping type (e.g., p-type doping).

In some embodiments, a process for forming the epitaxial layer 122 comprises a non-selective low-temperature epitaxial growth process. The non-selective low-temperature epitaxial growth process comprises heating the semiconductor substrate 102 in a processing chamber, and flowing a precursor compound and a dopant compound into the processing chamber to from the epitaxial layer 122. In some embodiments, the precursor compound comprises, for example, disilane ($Si_2H_6$), trisilane ($Si_3H_6$), or some other high-order silane(s). In further embodiments, the dopant compound may comprise diborane ($B_2H_6$).

In various embodiments, the non-selective low-temperature epitaxial growth process is performed in an environment having a temperature below about 500° C. and a pressure between about 5 Torr and about 12 Torr. Because the semiconductor substrate 102 is bonded to a second IC 403, the non-selective low-temperature epitaxial growth process is performed below about 500° C. to ensure the epitaxial layer 122 is formed over the back-side 102b of the semiconductor substrate 102 and lining the extended deep trenches 1002a-1002b without damaging the transfer transistor 306 and/or the MOSFET 404. In some embodiments, before the epitaxial layer 122 is formed, a baking process is performed on the semiconductor substrate 102 to remove impurities from the semiconductor substrate 102. The baking process may be performed in a hydrogen gas ($H_2$) environment at a temperature below about 500° C. and a pressure below about 2 Torr for about 10 minutes.

Also shown in FIG. 11, a second doped region 124 is formed in the semiconductor substrate 102 between the doped area 502 (see, e.g., FIG. 10) and the epitaxial layer 122. In some embodiments, the second doped region 124 is formed conformally along the epitaxial layer 122. In further embodiments, the second doped region 124 extends into the well region 107. In further embodiments, the second doped region 124 is formed in the semiconductor substrate 102 by driving the dopant of the epitaxial layer 122 into the semiconductor substrate 102. In yet further embodiments, forming the second doped region 124 forms a photodetector 103 in the semiconductor substrate 102. In some embodiments, the photodetector 103 comprises a first doped region 104 and a p-n junction that exists between the first doped region 104 and the second doped region 124. In such embodiments, the first doped region 104 may be a portion of the doped area 502 (see, e.g., FIG. 10) disposed between the second doped region 124 and the well region 107.

In some embodiments, the dopant of the epitaxial layer 122 is driven into the semiconductor substrate 102 during formation of the epitaxial layer 122. In further embodiments, after the epitaxial layer 122 is formed, an anneal process (e.g., rapid thermal anneal, microwave anneal, etc.) may be performed to drive the dopant into the semiconductor substrate 102. In further embodiments, the anneal process may be performed in-situ with the epitaxial process and in an environment having a temperature below about 500° C. and a pressure below about 2 Torr. In other embodiments, the anneal process may be an ex-situ process.

Driving the dopant of the epitaxial layer 122 into the semiconductor substrate 102 to form the second doped region 124 provides greater control over the profile of the first doped region 104 than utilizing a selective ion implantation process (e.g., prior to the formation of the transfer transistor 306) to define the profile of the first doped region 104. For example, the dopant may be driven into the semiconductor substrate 102 to form the second doped region 124 between the first doped region 104 and the epitaxial layer 122. On the other hand, if the first doped region 104 is formed by the selective ion implantation process, a size of the first doped region 104 may be undesirably reduced due to the difficulty in controlling the profile of the first doped region 104. Thus, driving the dopant of the epitaxial layer 122 into the semiconductor substrate 102 to form the second doped region 124 may increase the size of the first doped region 104. Accordingly, performance of the stacked CMOS image sensor may be improved by increasing the full well capacity of the photodetector 103.

Figure 12:
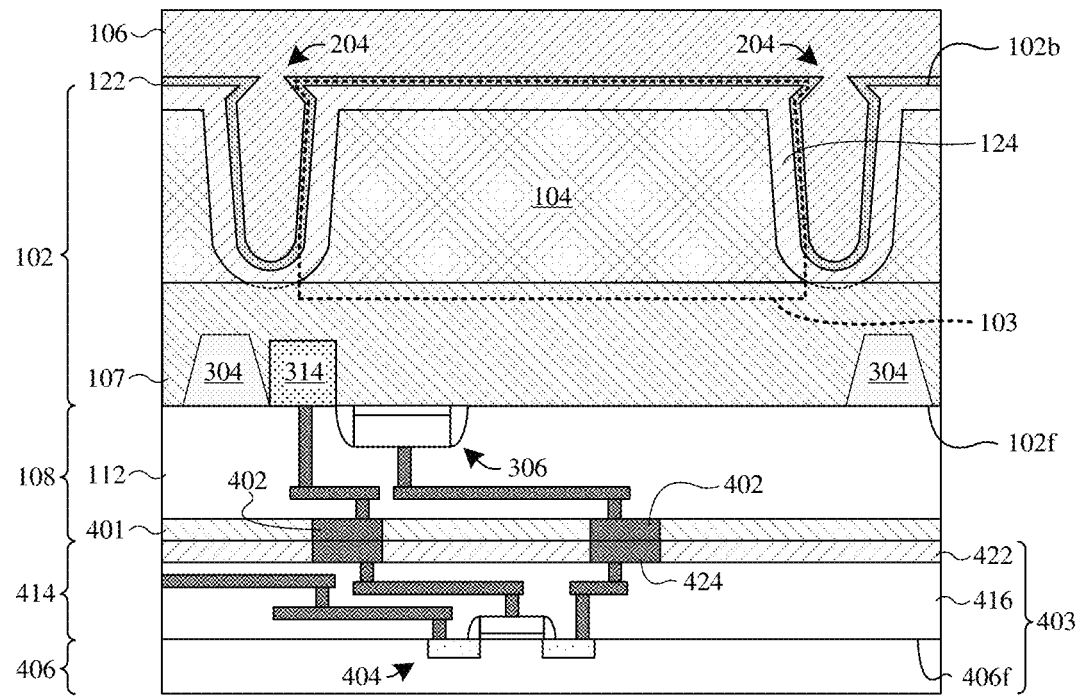

As shown in FIG. 12, a dielectric layer 106 is formed over the epitaxial layer 122 and in the extended deep trenches 1002a-1002b, such that portions of the dielectric layer 106 that extend into the deep trenches 1002a-1002b form backside deep trench isolation (BDTI) structures 204. In some embodiments, the dielectric layer 106 is formed on the epitaxial layer 122, such that the epitaxial layer 122 continuously contacts the dielectric layer 106 along the BDTI structures 204 and continuously along the back-side 102b of the semiconductor substrate 102. In further embodiments, the second doped region 124 is disposed between the first doped region 104 and the BDTI structures 204 and between the first doped region 104 and the dielectric layer 106. In yet further embodiments, a process for forming the dielectric layer comprises, for example, CVD, PVD, sputtering, thermal oxidation, or some other deposition or growth process.

Because the second doped region 124 is disposed between the first doped region 104 and the BDTI structures 204 (and the dielectric layer 106) and because the second doped region 124 comprises an opposite doping type as the first doped region 104, the second doped region 124 may isolate, (e.g., by p-n junction isolation) the first doped region 104 from the BDTI structures 204 and/or the dielectric layer 106. Thus, without increasing manufacturing complexities (e.g., an additional deposition process to deposit a high-k dielectric layer between the dielectric layer 106 and the semiconductor substrate 102), the second doped region 124 may improve dark current performance and/or white pixel numbers of the stacked CMOS image sensor by preventing noise signals caused by the BDTI structures 204 (e.g., Si—$SiO_2$ interface traps) or the dielectric layer 106 from being collected by the photodetector 103. Accordingly, the cost to manufacture the stacked CMOS image sensor may be reduced.

Figure 13:
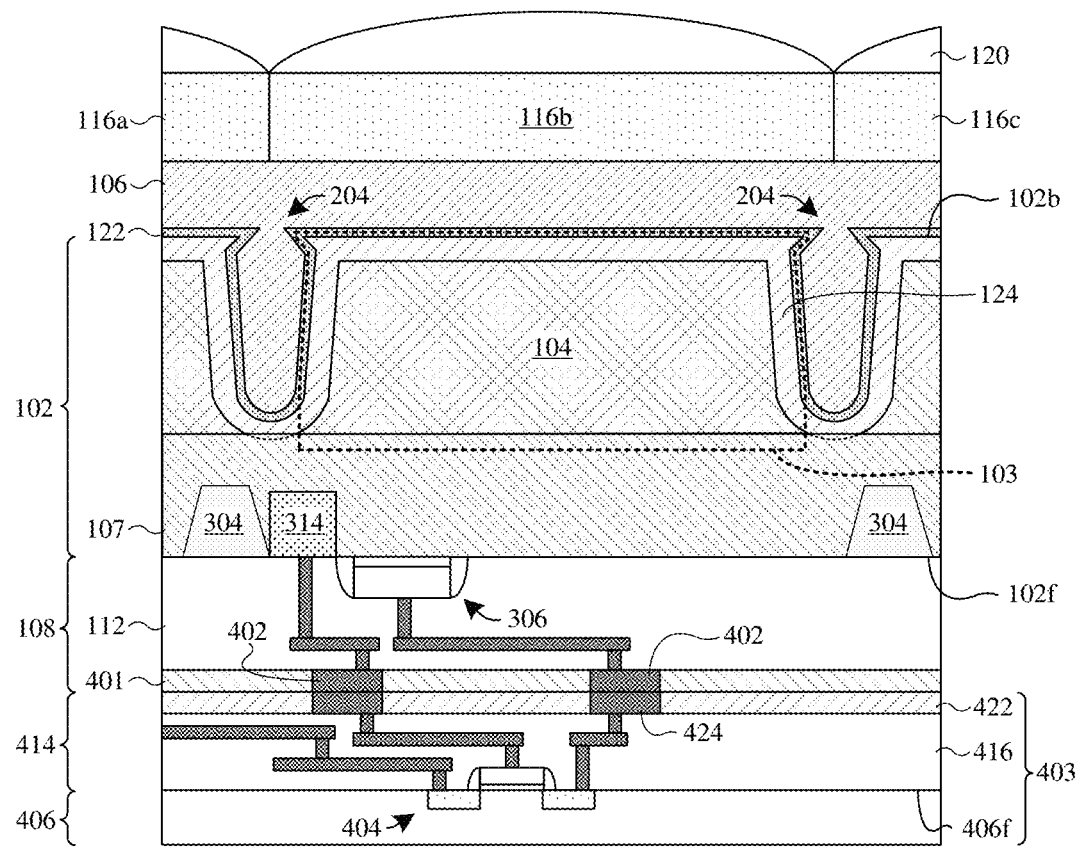

As shown in FIG. 13, a plurality of color filters 116a-116c are formed over the back-side 102b of the semiconductor substrate 102. In some embodiments, the plurality of color filters 116a-116c may be formed by forming a color filter layer and patterning the color filter layer. The color filter layer is formed of a material that allows for the transmission of radiation (e.g., light) having a specific range of wavelength, while blocking light of wavelengths outside of the specified range. Further, in some embodiments, the color filter layer is planarized subsequent to formation.

A plurality of micro-lenses 120 is formed over the plurality of color filters 116a-116c. In some embodiments, the plurality of micro-lenses 120 may be formed by depositing a micro-lens material above the plurality of color filters 116a-116c (e.g., by a spin-on method or a deposition process). A micro-lens template (not shown) having a curved upper surface is patterned above the micro-lens material. In some embodiments, the micro-lens template may comprise a photoresist material exposed using a distributing exposing light dose (e.g., for a negative photoresist more light is exposed at a bottom of the curvature and less light is exposed at a top of the curvature), developed and baked to form a rounding shape. The plurality of micro-lenses 120 are then formed by selectively etching the micro-lens material according to the micro-lens template.

Figure 14:
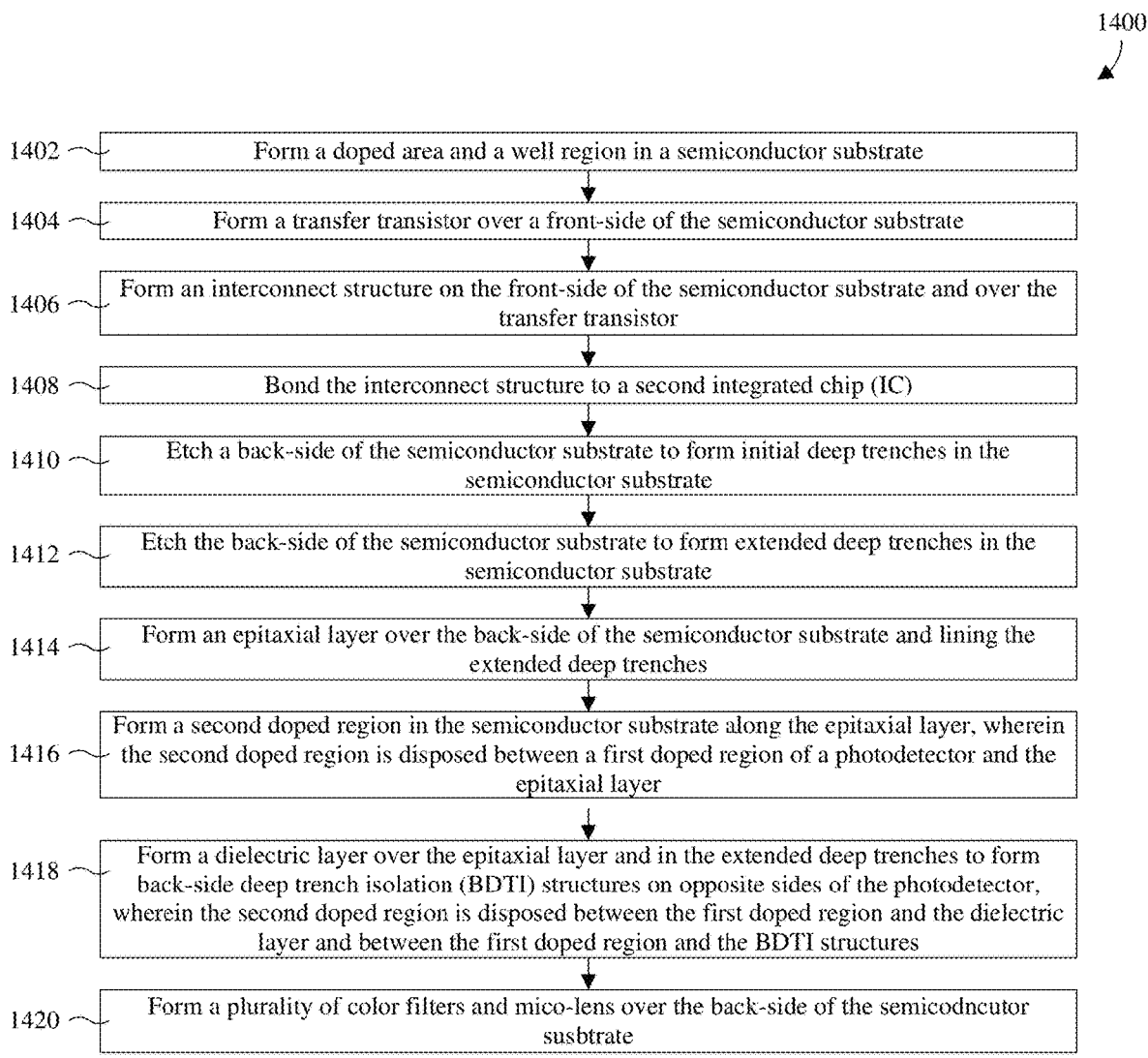
FIG. 14 illustrates a flowchart of some embodiments of a method for forming a stacked CMOS image sensor comprising a second doped region disposed between a first doped region and a dielectric layer to improve full well capacity.

As illustrated in FIG. 14, a flowchart 1400 of some embodiments of a method for forming a stacked CMOS image sensor comprising a second doped region disposed between a first doped region and a dielectric layer having to improve full well capacity is provided. While the flowchart 1400 of FIG. 14 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

At 1402, a doped area and a well region are formed in a semiconductor substrate. FIG. 5 illustrates a cross-sectional view of some embodiments corresponding to act 1402.

At 1404, a transfer transistor is formed over a front-side of the semiconductor substrate. FIG. 6 illustrates a cross-sectional view of some embodiments corresponding to act 1404.

At 1406, an interconnect structure is formed on the front-side of the semiconductor substrate and over the transfer transistor. FIG. 7 illustrates a cross-sectional view of some embodiments corresponding to act 1406.

At 1408, a second integrated chip (IC) is bonded to the interconnect structure. FIG. 8 illustrates a cross-sectional view of some embodiments corresponding to act 1408.

At 1410, a back-side of the semiconductor substrate is etched to form initial deep trenches in the semiconductor substrate. FIG. 9 illustrates a cross-sectional view of some embodiments corresponding to act 1410.

At 1412, the back-side of the semiconductor substrate is etched to form extended deep trenches in the semiconductor substrate. FIG. 10 illustrates a cross-sectional view of some embodiments corresponding to act 1412.

At 1414, an epitaxial layer is formed over the back-side of the semiconductor substrate and lining the extended deep trenches. FIG. 11 illustrates a cross-sectional view of some embodiments corresponding to act 1414.

At 1416, a second doped region is formed in the semiconductor substrate along the epitaxial layer, wherein the second doped region is disposed between a first doped region of a photodetector and the epitaxial layer. FIG. 11 illustrates a cross-sectional view of some embodiments corresponding to act 1416.

At 1418, a dielectric layer is formed over the epitaxial layer and in the extended deep trenches to form back-side deep trench isolation (BDTI) structures on opposing sides of the photodetector, wherein the second doped region is disposed between the first doped region and the dielectric layer and between the first doped region and the BDTI structures. FIG. 12 illustrates a cross-sectional view of some embodiments corresponding to act 1418.

At 1420, a plurality of color filters and micro-lens are formed over the back-side of the semiconductor substrate. FIG. 13 illustrates a cross-sectional view of some embodiments corresponding to act 1420.

In some embodiments, the present application provides a method for forming an image sensor. The method includes forming a plurality of trenches in a semiconductor substrate, where the trenches extend into the semiconductor substrate from a back-side of the semiconductor substrate. An epitaxial layer comprising a dopant is formed on lower surfaces of the trenches, sidewalls of the trenches, and the back-side of the semiconductor substrate, where the dopant has a first doping type. The dopant is driven into the semiconductor substrate to form a first doped region having the first doping type along the epitaxial layer, wherein the first doped region separates a second doped region having a second doping type opposite the first doping type from the sidewalls of the trenches and from the back-side of the semiconductor substrate. A dielectric layer is formed over the back-side of the semiconductor substrate, where the dielectric layer fills the trenches to form back-side deep trench isolation (BDTI) structures.

In other embodiments, the present application provides a complementary metal-oxide-semiconductor (CMOS) image sensor. The CMOS image sensor includes a first photodetector and a second photodetector disposed in a semiconductor substrate. A dielectric layer is disposed over a back-side of the semiconductor substrate, where the dielectric layer extends into the semiconductor substrate from the back-side of the semiconductor substrate between the first photodetector and the second photodetector to define a back-side trench isolation (BDTI) structure. An epitaxial layer is disposed between the BDTI structure and the semiconductor substrate. First doped regions are disposed in the semiconductor substrate, where the first doped regions extend along the epitaxial layer on opposite sides of the BDTI structure.

In yet other embodiments, the present application provides a method for forming a complementary metal-oxide-semiconductor (CMOS) image sensor. The method includes forming a first interconnect structure over a front-side of a first semiconductor wafer. A second interconnect structure is formed over a front-side of a second semiconductor wafer. The first interconnect structure is bonded to the second interconnect structure. After the first and second interconnect structures are bonded, a plurality of trenches are formed in the first semiconductor wafer, where the trenches extend into the first semiconductor wafer from a back-side of the first semiconductor wafer opposite the front-side of the first semiconductor wafer. An epitaxial layer is formed lining the trenches and the back-side of the first semiconductor wafer. A photodetector is formed in the first semiconductor wafer between the trenches. The trenches are filled with a dielectric layer to form back-side deep trench isolation (BDTI) structures in the first semiconductor wafer, where the dielectric layer extends over the back-side of the first semiconductor wafer, and where the epitaxial layer continuously contacts the first semiconductor wafer and the dielectric layer along sidewalls of the BDTI structures, along lower surfaces of the BDTI structures, and along the back-side of the first semiconductor wafer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An image sensor comprising:
   a photodetector disposed in a semiconductor substrate, wherein the photodetector comprises a first doped region in the semiconductor substrate;
   a filler material disposed over a back-side of the semiconductor substrate, wherein a first portion of the filler material extends into the semiconductor substrate to define a first back-side trench isolation (BDTI) structure, a second portion of the filler material extends into the semiconductor substrate to define a second BDTI structure, and a third portion of the filler material extends from the first portion of the filler material to the second portion of the filler material, and wherein the first BDTI structure and the second BDTI structure are disposed on opposite sides of the first doped region;
   an epitaxial structure lining the filler material and the semiconductor substrate, wherein the epitaxial structure is a semiconductor material, and wherein the filler material contacts the epitaxial structure; and
   a second doped region disposed in the semiconductor substrate and between the epitaxial structure and the first doped region, wherein the second doped region has an opposite doping type as the first doped region.

2. The image sensor of claim 1, wherein the filler material has a same chemical composition in the first portion of the filler material, the second portion of the filler material, and the third portion of the filler material.

3. The image sensor of claim 1, wherein the epitaxial structure contacts both the filler material and the semiconductor substrate.

4. The image sensor of claim 1, wherein the third portion of the filler material contacts the epitaxial structure between opposite sides of the photodetector.

5. The image sensor of claim 1, wherein the epitaxial structure contacts the first portion of the filler material, the second portion of the filler material, and the third portion of the filler material.

6. The image sensor of claim 1, wherein:
the epitaxial structure contacts both the first portion of the filler material and the semiconductor substrate;
the epitaxial structure contacts both the second portion of the filler material and the semiconductor substrate; and
the epitaxial structure contacts both the third portion of the filler material and the semiconductor substrate.

7. The image sensor of claim 1, wherein the third portion of the filler material has a substantially planar uppermost surface that extends laterally from a first side of the first BDTI structure to a second side of the first BDTI structure opposite the first side of the first BDTI structure.

8. The image sensor of claim 7, wherein the substantially planar uppermost surface of the third portion of the filler material also extends laterally over the photodetector and the second BDTI structure.

9. An image sensor comprising:
a first photodetector disposed in a semiconductor substrate, wherein the first photodetector comprises a first doped region having a first doping type;
a second photodetector disposed in the semiconductor substrate, wherein the second photodetector comprises a second doped region having the first doping type;
a back-side trench isolation (BDTI) structure disposed in the semiconductor substrate and between the first doped region and the second doped region, wherein the BDTI structure is defined by a portion of a filler material that extends into the semiconductor substrate from a back-side of the semiconductor substrate;
an epitaxial structure lining the BDTI structure and the semiconductor substrate, wherein the epitaxial structure is a semiconductor material, wherein the portion of the filler material contacts the epitaxial structure, wherein the epitaxial structure has a first sidewall and a second sidewall that face one another, and wherein the portion of the filler material extends continuously from the first sidewall of the epitaxial structure to the second sidewall of the epitaxial structure; and
a third doped region disposed in the semiconductor substrate and extending along the epitaxial structure, wherein the third doped region has a second doping type opposite the first doping type.

10. The image sensor of claim 9, wherein:
a segment of the portion of the filler material extends continuously from the first sidewall of the epitaxial structure to the second sidewall of the epitaxial structure; and
the segment of the filler material is substantially aligned with the back-side of the semiconductor substrate.

11. The image sensor of claim 9, wherein a chemical composition of the filler material is the same from the first sidewall to the second sidewall.

12. The image sensor of claim 9, wherein:
the epitaxial structure comprises a third sidewall, a fourth sidewall, and a lower surface;
the third sidewall is opposite the fourth sidewall;
both the first sidewall and the second sidewall are disposed between the third sidewall and the fourth sidewall; and
the lower surface is a rounded surface that extends from the third sidewall to the fourth sidewall.

13. The image sensor of claim 12, wherein the third sidewall and the fourth sidewall are angled.

14. The image sensor of claim 13, wherein:
the epitaxial structure comprises a fifth sidewall and a sixth sidewall;
the fifth sidewall extends from the third sidewall to the back-side of the semiconductor substrate;
the sixth sidewall extends from the fourth sidewall to the back-side of the semiconductor substrate;
the third sidewall and the fourth sidewall angle outward from a centerline of the BDTI structure; and
the fifth sidewall and the sixth sidewall angle inward toward the centerline of the BDTI structure.

15. The image sensor of claim 9, wherein:
the epitaxial structure comprises a third sidewall, a fourth sidewall, a first lower surface, and a second lower surface;
the third sidewall is opposite the fourth sidewall;
the third sidewall and the fourth sidewall are substantially vertical;
the first lower surface extends at a first angle from the third sidewall to a point; and
the second lower surface extends at a second angle from the fourth sidewall to the point.

16. The image sensor of claim 15, wherein:
the epitaxial structure has a first thickness along the third sidewall;
the epitaxial structure has a second thickness along the first lower surface; and
the second thickness is greater than the first thickness.

17. The image sensor of claim 15, wherein:
the epitaxial structure comprises a fifth sidewall and a sixth sidewall;
the fifth sidewall extends from the third sidewall to the back-side of the semiconductor substrate;
the sixth sidewall extends from the fourth sidewall to the back-side of the semiconductor substrate;
the first lower surface and the second lower surface extend outward from the point; and
the fifth sidewall and the sixth sidewall extend inward toward the point.

18. An image sensor comprising:
a first photodetector disposed in a semiconductor substrate, wherein the first photodetector comprises a first doped region having a first doping type;
a second photodetector disposed in the semiconductor substrate, wherein the second photodetector comprises a second doped region having the first doping type;
a back-side trench isolation (BDTI) structure disposed in the semiconductor substrate and between the first doped region and the second doped region, wherein the BDTI structure extends into the semiconductor substrate from a back-side of the semiconductor substrate;

an epitaxial structure lining the BDTI structure, wherein the epitaxial structure separates the BDTI structure from the semiconductor substrate;

a third doped region disposed in the semiconductor substrate, wherein the third doped region has a second doping type opposite the first doping type, and wherein the third doped region is disposed between the BDTI structure and the first doped region and between the BDTI and the second doped region; and a well region disposed in the semiconductor substrate and extending into the semiconductor substrate from a front-side of the semiconductor substrate opposite the back-side of the semiconductor substrate, and wherein the first doped region extends into the well region from the back-side of the semiconductor substrate.

19. The image sensor of claim 18, wherein the well region has the second doping type.

20. The image sensor of claim 19, wherein:

the third doped region is disposed between the first doped region and the back-side of the semiconductor substrate; and the third doped region is disposed between the second doped region and the back-side of the semiconductor substrate.

* * * * *